(12) United States Patent
Kobayashi

(10) Patent No.: US 11,644,495 B2
(45) Date of Patent: May 9, 2023

(54) MEASUREMENT METHOD, NON-TRANSITORY COMPUTER-READABLE MEDIUM AND MEASUREMENT APPARATUS FOR DETERMINING WHETHER A RADIO WAVE RECEIVING APPARATUS CAN OPERATE AT AN INSTALLABLE POSITION

(71) Applicant: KYOCERA Corporation, Kyoto (JP)

(72) Inventor: Kazuhiko Kobayashi, Daito (JP)

(73) Assignee: KYOCERA Corporation, Kyoto (JP)

( * ) Notice: Subject to any disclaimer, the term of this patent is extended or adjusted under 35 U.S.C. 154(b) by 324 days.

(21) Appl. No.: 16/652,392

(22) PCT Filed: Oct. 18, 2018

(86) PCT No.: PCT/JP2018/038873
§ 371 (c)(1),
(2) Date: Mar. 30, 2020

(87) PCT Pub. No.: WO2019/087804
PCT Pub. Date: May 9, 2019

(65) Prior Publication Data
US 2020/0271708 A1 Aug. 27, 2020

(30) Foreign Application Priority Data
Oct. 30, 2017 (JP) .............................. JP2017-209478

(51) Int. Cl.
G01R 29/08 (2006.01)
H04B 17/20 (2015.01)
(Continued)

(52) U.S. Cl.
CPC .......... *G01R 29/0814* (2013.01); *H02J 50/20* (2016.02); *H02J 50/40* (2016.02);
(Continued)

(58) Field of Classification Search
None
See application file for complete search history.

(56) References Cited

U.S. PATENT DOCUMENTS 8,159,364 B2  4/2012  Zeine
8,410,953 B2  4/2013  Zeine
(Continued)

FOREIGN PATENT DOCUMENTS

JP  H04-337475 A  11/1992
JP  2005-252700 A  9/2005
(Continued)

OTHER PUBLICATIONS

English Translation of JP 2017-058863 (Year: 2017).*

*Primary Examiner* — Douglas X Rodriguez
(74) *Attorney, Agent, or Firm* — Studebaker & Brackett PC

(57) ABSTRACT

A measurement method includes: measuring a reception intensity of radio waves transmitted from a radio wave transmitting apparatus at an installable position of a radio wave receiving apparatus operated by power of radio waves transmitted from the radio wave transmitting apparatus; and determining, on the basis of the reception intensity of radio waves, if the radio wave receiving apparatus can operate when installed at the installable position.

18 Claims, 7 Drawing Sheets

(51) Int. Cl.
*H02J 50/80* (2016.01)
*H02J 50/20* (2016.01)
*H02J 50/40* (2016.01)
*H02J 50/60* (2016.01)

(52) U.S. Cl.
CPC .............. *H02J 50/80* (2016.02); *H04B 17/20* (2015.01); *H02J 50/60* (2016.02)

(56) References Cited

U.S. PATENT DOCUMENTS

| | | |
|---|---|---|
| 8,558,661 B2 | 10/2013 | Zeine |
| 8,624,548 B2 | 1/2014 | Yamazaki et al. |
| 8,854,176 B2 | 10/2014 | Zeine |
| 9,114,718 B2 | 8/2015 | Yamazaki et al. |
| 9,137,407 B2 | 9/2015 | Onishi |
| 9,142,973 B2 | 9/2015 | Zeine |
| 10,008,887 B2 | 6/2018 | Zeine |
| 10,075,025 B2 | 9/2018 | Ichikawa |
| 10,396,602 B2 | 8/2019 | Zeine |
| 10,566,846 B2 | 2/2020 | Zeine |
| 2010/0315045 A1 | 12/2010 | Zeine |
| 2011/0193520 A1 | 8/2011 | Yamazaki et al. |
| 2012/0193999 A1 | 8/2012 | Zeine |
| 2013/0060496 A1 | 3/2013 | Narita |
| 2013/0207604 A1 | 8/2013 | Zeine |
| 2014/0035524 A1 | 2/2014 | Zeine |
| 2014/0117932 A1 | 5/2014 | Yamazaki et al. |
| 2014/0198338 A1 | 7/2014 | Onishi |
| 2015/0022022 A1 | 1/2015 | Zeine |
| 2016/0013685 A1 | 1/2016 | Zeine |
| 2016/0141882 A1 | 5/2016 | Ichikawa |
| 2016/0301264 A1* | 10/2016 | Zeine ...................... H02J 7/025 |
| 2017/0358959 A1 | 12/2017 | Zeine |
| 2018/0312070 A1* | 11/2018 | Caldwell ................. B60L 53/36 |
| 2018/0351370 A1 | 12/2018 | Ichikawa |
| 2019/0386521 A1 | 12/2019 | Zeine |

FOREIGN PATENT DOCUMENTS

| | | |
|---|---|---|
| JP | 2011-182633 A | 9/2011 |
| JP | 2012-199727 A | 10/2012 |
| JP | 2013-055730 A | 3/2013 |
| JP | 2014-079091 A | 5/2014 |
| JP | 2014-135862 A | 7/2014 |
| JP | 2014-193095 A | 10/2014 |
| JP | 2014-223018 A | 11/2014 |
| JP | 2016-082739 A | 5/2016 |
| JP | 2016-226075 A | 12/2016 |
| JP | 2017-058863 A | 3/2017 |
| JP | 2017058863 A * | 3/2017 |
| WO | 2014/203346 A1 | 12/2014 |
| WO | 2016/164772 A1 | 10/2016 |

* cited by examiner

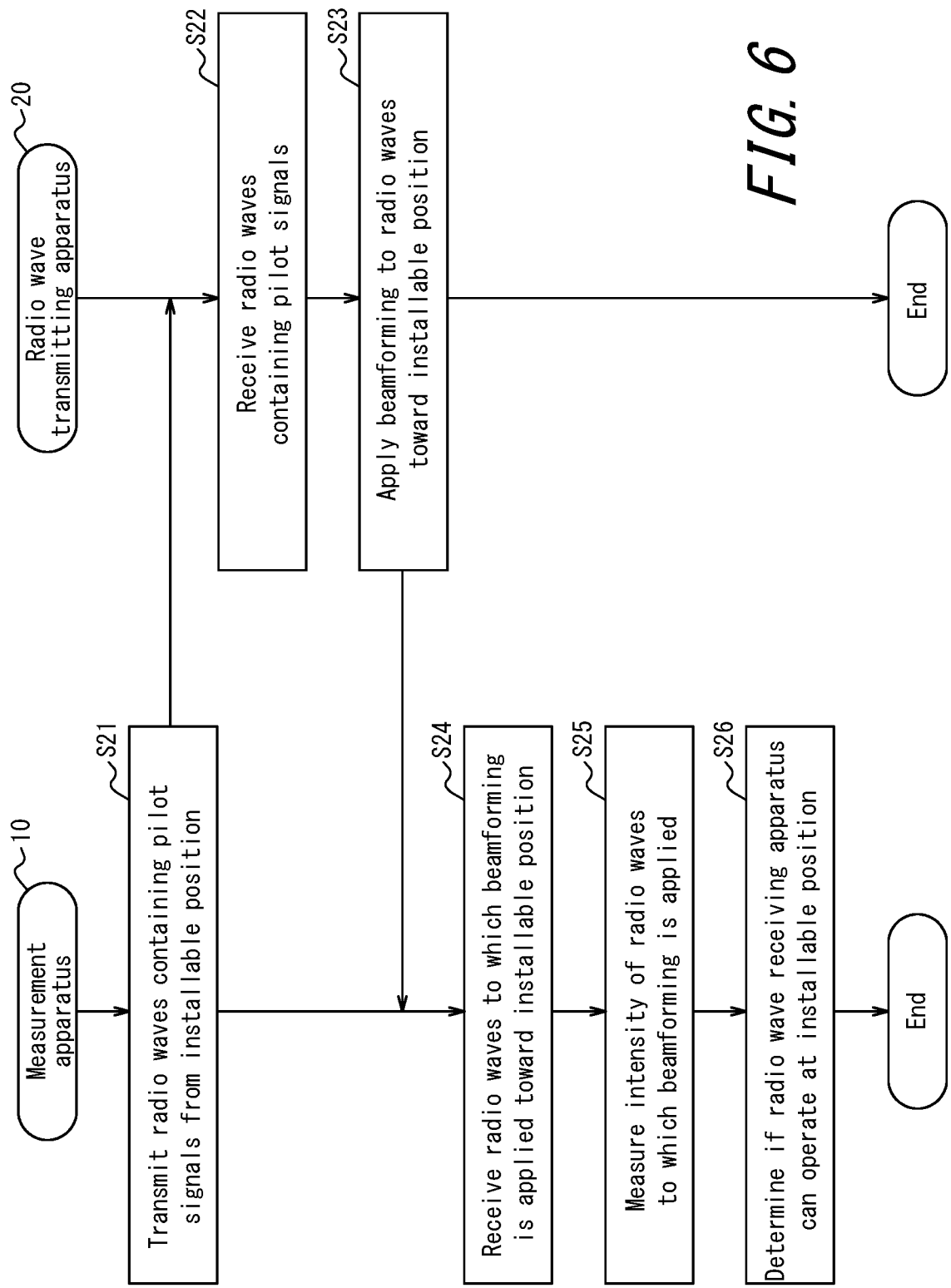

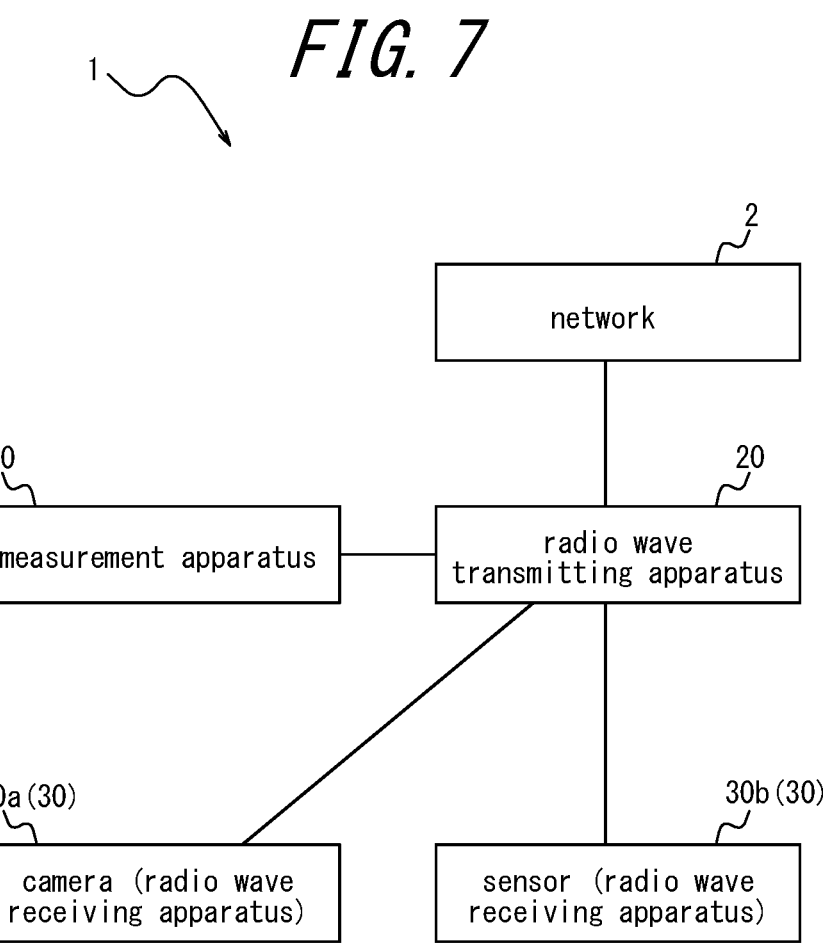

MEASUREMENT METHOD, NON-TRANSITORY COMPUTER-READABLE MEDIUM AND MEASUREMENT APPARATUS FOR DETERMINING WHETHER A RADIO WAVE RECEIVING APPARATUS CAN OPERATE AT AN INSTALLABLE POSITION

CROSS-REFERENCE TO RELATED APPLICATION

This application claims priority to and the benefit of Japanese Patent Application No. 2017-209478 filed on Oct. 30, 2017, the entire disclosure of which being incorporated herein by reference.

TECHNICAL FIELD

This disclosure relates to a measurement method, a non-transitory computer-readable medium and a measurement apparatus.

BACKGROUND

A method of supplying electric power to an electronic device by using electromagnetic waves is known. For example, Patent Literature (PTL) 1 discloses an electric power transmission apparatus that supplies electric power to a device by using microwaves.

CITATION LIST

Patent Literature

PTL 1: JP2014-223018A

SUMMARY

In a measurement method according to an embodiment of this disclosure, at an installable position of a radio wave receiving apparatus operated by power of radio waves transmitted from a radio wave transmitting apparatus, a reception intensity of radio waves transmitted from the radio wave transmitting apparatus is measured. In the measurement method, if the radio wave receiving apparatus can operate when installed at the installable position is determined on the basis of the reception intensity of the radio waves.

A non-transitory computer-readable medium according to an embodiment of this disclosure includes a program for causing a measurement apparatus installed at an installable position of a radio wave receiving apparatus operated by power of radio waves transmitted from a radio wave transmitting apparatus to measure a reception intensity of radio waves transmitted from the radio wave transmitting apparatus. The measurement program causes the measurement apparatus to determine if the radio wave receiving apparatus can operate when installed at the position on the basis of the reception intensity of the radio waves.

A measurement apparatus according to an embodiment of this disclosure includes a receiver configured to receive radio waves transmitted from the radio wave transmitting apparatus at an installable position of a radio wave receiving apparatus operated by power of radio waves transmitted from the radio wave transmitting apparatus. The measurement apparatus includes a controller configured to measure a reception intensity of the radio waves and determine if the radio wave receiving apparatus can operate when installed at the installable position on the basis of the reception intensity of the radio waves.

BRIEF DESCRIPTION OF THE DRAWINGS

In the accompanying drawings:

FIG. 6 is a flowchart illustrating an example of a procedure for determining whether or not the radio wave receiving apparatus can operate; and FIG. 7 is a diagram illustrating a schematic configuration example of an electric power transmission system according to an embodiment.

DETAILED DESCRIPTION

Figure 1:
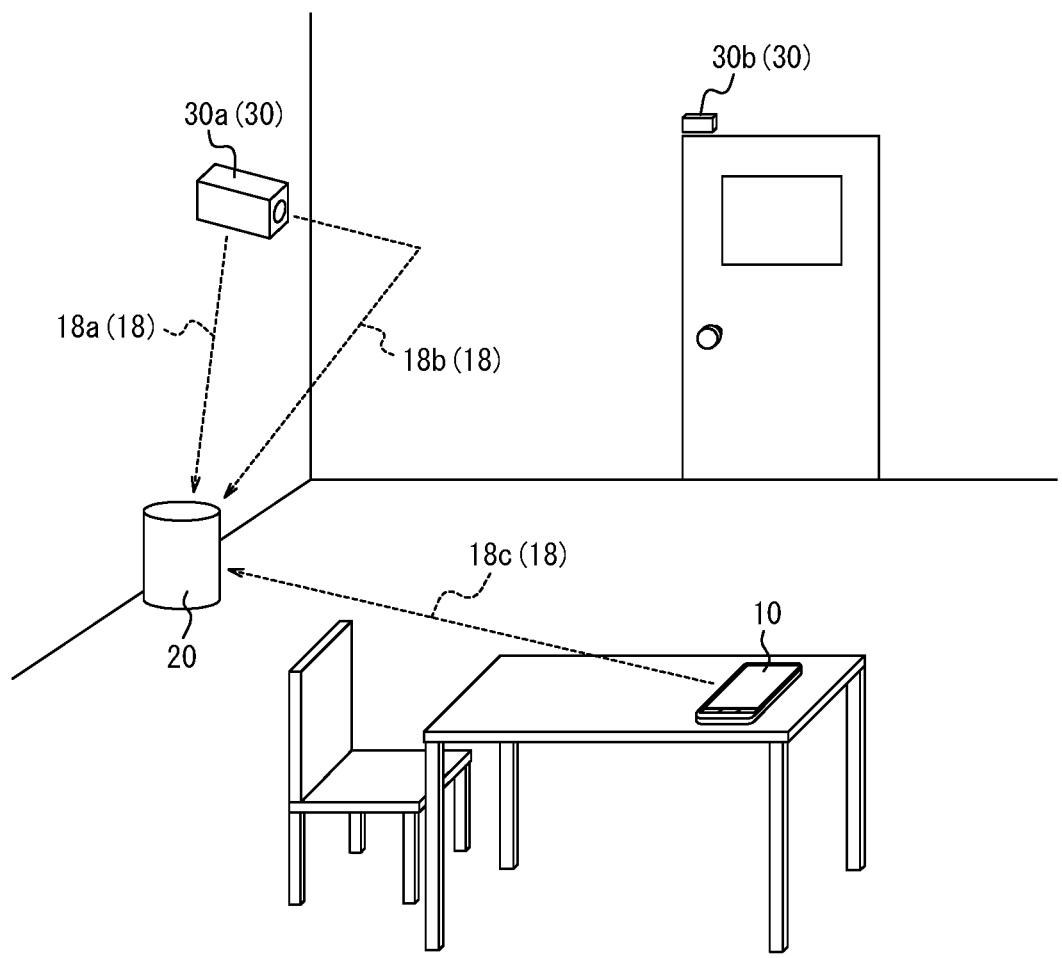
FIG. 1 is a diagram illustrating a schematic configuration example of an electric power transmission system according to an embodiment.
Figure 2:
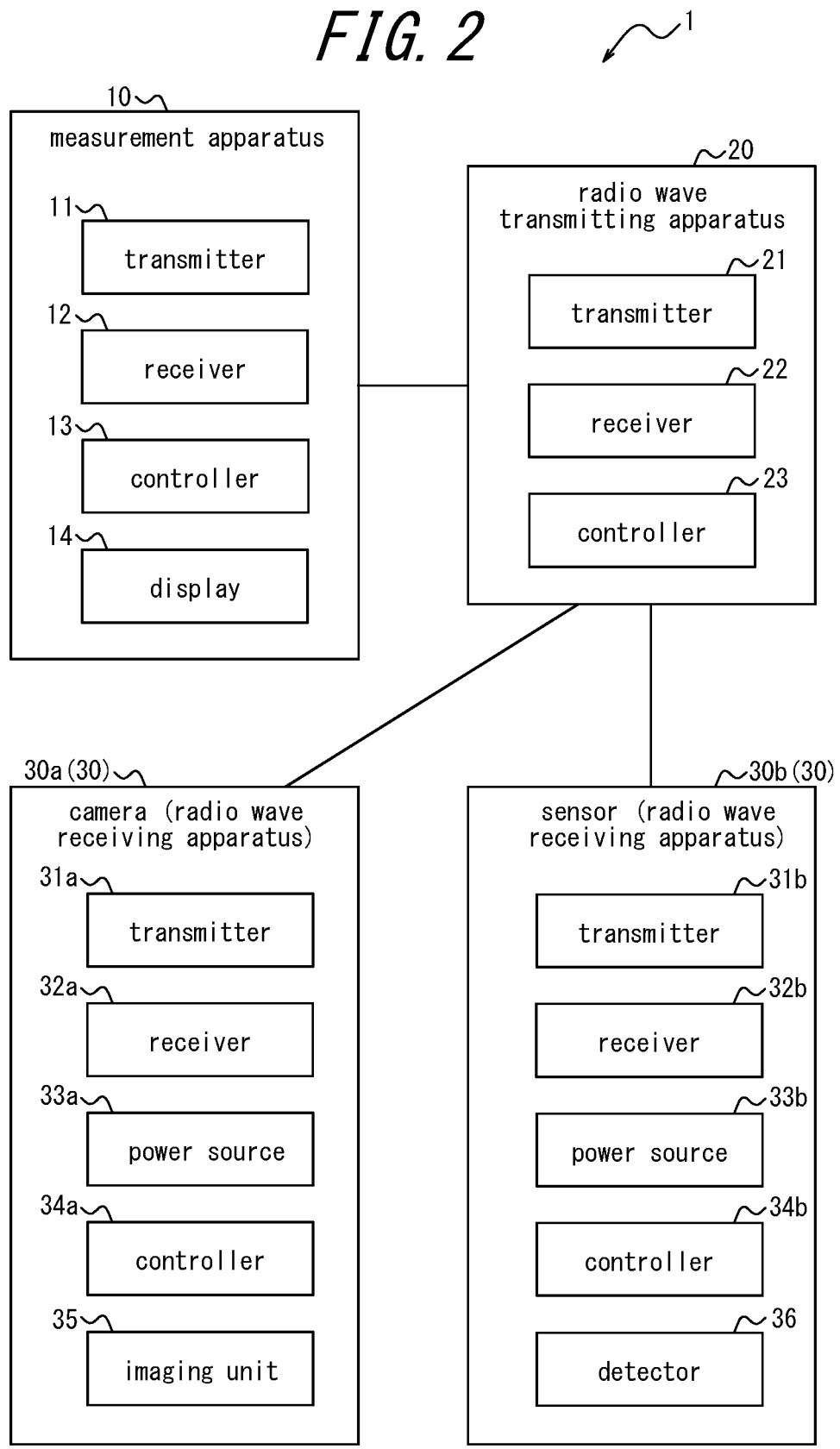
FIG. 2 is a block diagram illustrating a schematic configuration example of the electric power transmission system illustrated in FIG. 1.

As illustrated in FIGS. 1 and 2, an electric power transmission system 1 according to an embodiment includes a radio wave transmitting apparatus 20 and a radio wave receiving apparatus 30. The radio wave receiving apparatus 30 may include a camera 30a. The camera 30a may be a security camera that monitors indoors, for example. The radio wave receiving apparatus 30 may include a sensor 30b. The sensor 30b may be an open/close sensor configured to detect opening and closing of doors, for example. The camera 30a or the sensor 30b may be a sensor configured to build an IoT network for home use.

The radio wave transmitting apparatus 20 may include a transmitter 21, a receiver 22 and a controller 23. The transmitter 21 may transmit radio waves to the radio wave receiving apparatus 30. The receiver 22 may receive radio waves transmitted from the radio wave receiving apparatus 30. The transmitter 21 and the receiver 22 may each include an antenna. The transmitter 21 and the receiver 22 may include an antenna configured to be used in common for transmission and reception. The controller 23 may generate a communication signal to be transmitted from the transmitter 21. The transmitter 21 may transmit radio waves on the basis of a communication signal obtained from the controller 23. The controller 23 may obtain a communication signal on the basis of radio waves received by the receiver 22.

The camera 30a may include a transmitter 31a, a receiver 32a, a power source 33a, a controller 34a and an imaging unit 35. The transmitter 31a may transmit radio waves to the radio wave transmitting apparatus 20. The receiver 32a may receive radio waves transmitted from the radio wave transmitting apparatus 20. The power source 33a may convert at least a part of radio waves received by the receiver 32a into electricity and supply the electricity to each component of the camera 30a. The controller 34a may control each component of the camera 30a. The imaging unit 35 may include an imaging optical system such as a lens and an imaging element. The imaging unit 35 may capture an object image entered the imaging optical system with an imaging element.

The sensor 30b may include a transmitter 31b, a receiver 32b, a power source 33b, a controller 34b and a detector 36. The transmitter 31b and the receiver 32b may act in the same or similar manner as the transmitter 31a and the receiver 32a of the camera 30a. The power source 33b may convert at least a part of radio waves received by the receiver 32b into electricity and supply the electricity to each component of the sensor 30b. The controller 34b may control each component of the sensor 30b. When the sensor 30b is an open/close sensor for doors, the detector 36 may be a proximity sensor attached to a door and a case, for example. The detector 36 may detect that a door is opened when each proximity sensor separates further than a predetermined distance and detect that a door is closed when each proximity sensor comes close within a predetermined distance. The detector 36 may detect not only opening and closing of a door but also various events. The detector 36 may detect a target event not only by a proximity sensor but also by other various forms.

The radio wave receiving apparatus 30 is not limited to the camera 30a and the sensor 30b, and may be various apparatuses such as a clock, a remote controller and a terminal apparatus.

The radio wave transmitting apparatus 20 transmits radio waves to the radio wave receiving apparatus 30. The radio wave receiving apparatus 30 may receive radio waves transmitted from the radio wave transmitting apparatus 20. The radio wave receiving apparatus 30 may obtain energy of radio waves transmitted from the radio wave transmitting apparatus 20 as electric power. The radio wave receiving apparatus 30 may operate with the electric power. The radio wave receiving apparatus 30 may obtain a communication signal contained in radio waves transmitted from the radio wave transmitting apparatus 20. The radio wave receiving apparatus 30 may transmit radio waves containing communication signals to the radio wave transmitting apparatus 20. In other words, the radio wave transmitting apparatus 20 and the radio wave receiving apparatus 30 may communicate with each other through transmission and reception of communication signals.

In the electric power transmission system 1, the radio wave receiving apparatus 30 can be installed at a predetermined position. The transmitter 21 of the radio wave transmitting apparatus 20 may have a nondirectional antenna. The transmitter 21 may transmit radio waves through a nondirectional antenna. In this manner, the radio wave transmitting apparatus 20 can transmit radio waves to the radio wave receiving apparatus 30 regardless of where the radio wave receiving apparatus 30 is installed.

The controller 23 of the radio wave transmitting apparatus 20 may obtain, from the radio wave receiving apparatus 30, the information about the position where the radio wave receiving apparatus 30 is installed. The transmitter 21 may have a directional antenna and transmit directional radio waves. The controller 23 may cause the transmitter 21 to transmit radio waves with directivity toward the radio wave receiving apparatus 30 on the basis of the information about the position where the radio wave receiving apparatus 30 is installed. In other words, the controller 23 may apply beamforming to the radio waves to be transmitted. The radio waves with directivity toward the radio wave receiving apparatus 30 can arrive at the radio wave receiving apparatus 30 with intensity higher than that of nondirectional radio waves. In this manner, the radio wave transmitting apparatus 20 can control the intensity of radio waves that reach the radio wave receiving apparatus 30.

The radio wave receiving apparatus 30 may transmit radio waves containing pilot signals. The pilot signal may include the information about a position where the radio wave receiving apparatus 30 is installed. The receiver 22 of the radio wave transmitting apparatus 20 may receive radio waves containing pilot signals. The controller 23 may obtain a position of the radio wave receiving apparatus 30 on the basis of pilot signals contained in the radio waves received by the receiver 22. The receiver 22 may have a directional antenna. The receiver 22 may detect, by a directional antenna, from which direction the radio waves containing pilot signals have arrived at the radio wave transmitting apparatus 20. The controller 23 may obtain the information, detected by the receiver 22, about the direction from which the radio waves containing pilot signals have arrived. The controller 23 may obtain the information about the direction from which the radio waves containing pilot signals have arrived as the information about the position where the radio wave receiving apparatus 30 is installed.

As illustrated in FIG. 1, the radio waves containing pilot signals transmitted from the radio wave receiving apparatus 30 can reach the radio wave transmitting apparatus 20 by propagating through a predetermined channel 18. The predetermined channel 18 may include a channel 18a that directly arrives at the radio wave transmitting apparatus 20 from the radio wave receiving apparatus 30, for example, or a channel 18b that arrives at the radio wave transmitting apparatus 20 from the radio wave receiving apparatus 30 through reflection at a wall. In other words, the radio wave transmitting apparatus 20 may receive radio waves containing pilot signals arriving from one direction or receive radio waves containing pilot signals arriving from two or more directions. When radio waves containing pilot signals arrive from two or more directions, the receiver 22 may detect each of two or more directions.

The controller 23 may apply beamforming to radio waves toward the direction from which the radio waves containing pilot signals have arrived. The controller 23 may apply beamforming to radio waves toward a predetermined channel 18a on the basis of arrival of radio waves containing pilot signals from the predetermined channel 18a illustrated in FIG. 1, for example. In this manner, the intensity of radio waves to be arrived at the radio wave receiving apparatus 30 that has transmitted radio waves containing pilot signals can be enhanced on the basis of the property of radio waves that go backward through a propagation channel. When radio waves containing pilot signals arrive from two or more directions, the controller 23 may apply beamforming to radio waves toward each of the directions. The controller 23 may apply beamforming, on the basis of arrival of radio waves containing pilot signals from predetermined channels 18a and 18b illustrated in FIG. 1, for example, to the radio waves toward both of the predetermined channels 18a and 18b.

The controller 23 may control, in a time division manner, the direction in which the radio waves transmitted by the transmitter 21 is applied with beamforming. The controller 23 may apply beamforming, in a time division manner, to the radio waves transmitted to each of the camera 30a and the sensor 30b illustrated in FIG. 1, for example.

Figure 3:
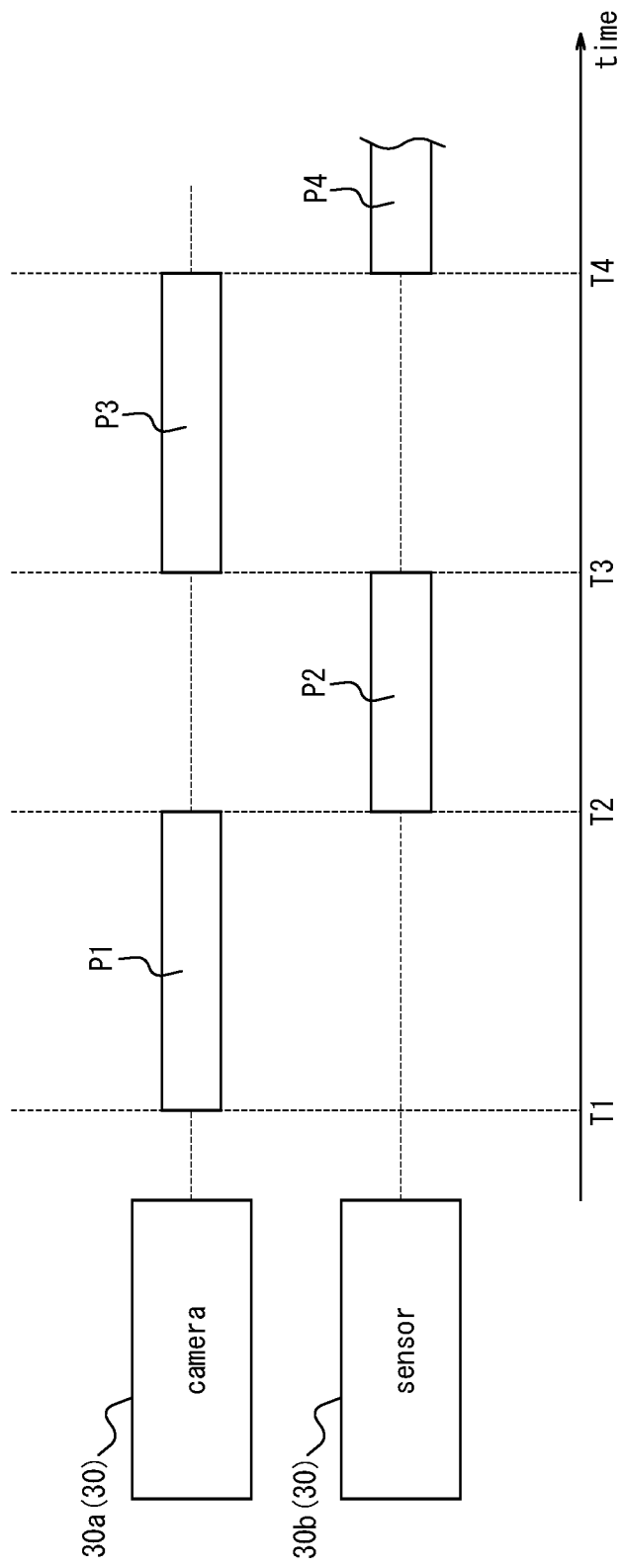
FIG. 3 is a timing chart illustrating an example of timing of transmitting radio waves.

As illustrated in the timing chart in FIG. 3, for example, the controller 23 may apply beamforming to radio waves for the camera 30a in period P1 from time T1 to T2. The controller 23 may apply beamforming to radio waves for the sensor 30b in period P2 from time T2 to T3. The controller 23 may apply beamforming to radio waves again for the camera 30a in period P3 from time T3 to T4. The controller 23 may apply beamforming to radio waves again for the sensor 30b in period P4 after time T4.

The controller 23 may apply beamforming to radio waves for each of a plurality of radio wave receiving apparatuses 30 in one cycle, which is a period from T1 to T3 (P1+P2). The controller 23 may change a radio wave receiving apparatus 30 which is a target toward which radio waves are applied with beamforming not only by the timing illustrated in FIG. 3 but also by various timings. The controller 23 may change the radio wave receiving apparatus 30 which is a target toward which radio waves are applied with beamforming periodically or at random.

The power of radio waves capable of being transmitted simultaneously by the radio wave transmitting apparatus 20 may have its upper limit. The upper limit of the power of radio waves capable of being transmitted simultaneously by the radio wave transmitting apparatus 20 is also referred to as an electric power transmission upper limit. When beamforming is applied to radio waves in one direction, the controller 23 may control the power of radio waves to be transmitted to be equal to or lower than the electric power transmission upper limit. When beamforming is applied to radio waves in more than one direction, the controller 23 may control the total power of radio waves to be transmitted to each direction to be equal to or lower than the electric power transmission upper limit. When beamforming is applied to radio waves in a time division manner, the controller 23 may control the total power of radio waves to be transmitted simultaneously to be equal to or lower than the electric power transmission upper limit. When the transmitter 21 transmits nondirectional radio waves, the controller 23 may control power of radio waves to be transmitted by the transmitter 21 to be equal to or lower than the electric power transmission upper limit.

The measurement apparatus 10 may receive radio waves transmitted from the radio wave transmitting apparatus 20 at a predetermined position where the radio wave receiving apparatus 30 can be installed and measure the reception intensity of the radio waves. The predetermined position where the radio wave receiving apparatus 30 can be installed is also referred to as an installable position.

As illustrated in FIG. 2, the measurement apparatus 10 according to an embodiment includes a receiver 12 and a controller 13. The measurement apparatus 10 may further include a transmitter 11. The measurement apparatus 10 may further include a display 14. The transmitter 11 may transmit radio waves to the radio wave transmitting apparatus 20. The receiver 12 may receive radio waves transmitted from the radio wave transmitting apparatus 20. The controller 13 may control a waveform of the radio waves transmitted from the transmitter 11. The controller 13 may obtain communication signals from radio waves received by the receiver 12. The controller 13 may calculate the reception intensity of radio waves received by the receiver 12. The controller 13 may determine if the radio wave receiving apparatus 30 can operate when installed at the installable position on the basis of the reception intensity of radio waves received by the receiver 12 at the installable position. The display 14 may include a display device such as, for example, a liquid crystal, an organic electro-luminescence (EL), an inorganic EL or a light emission diode (LED) and the like.

By determining whether or not the radio wave receiving apparatus 30 can operate at the installable position by the measurement apparatus 10, whether or not the radio wave receiving apparatus 30 can operate can be determined without actually installing the radio wave receiving apparatus 30 at the installable position. In other words, a situation where the radio wave receiving apparatus 30 cannot operate is less likely to occur despite actual installation of the radio wave receiving apparatus 30 at the installable position. As a result, usefulness of electric power transmission and reception can be enhanced.

Figure 4:
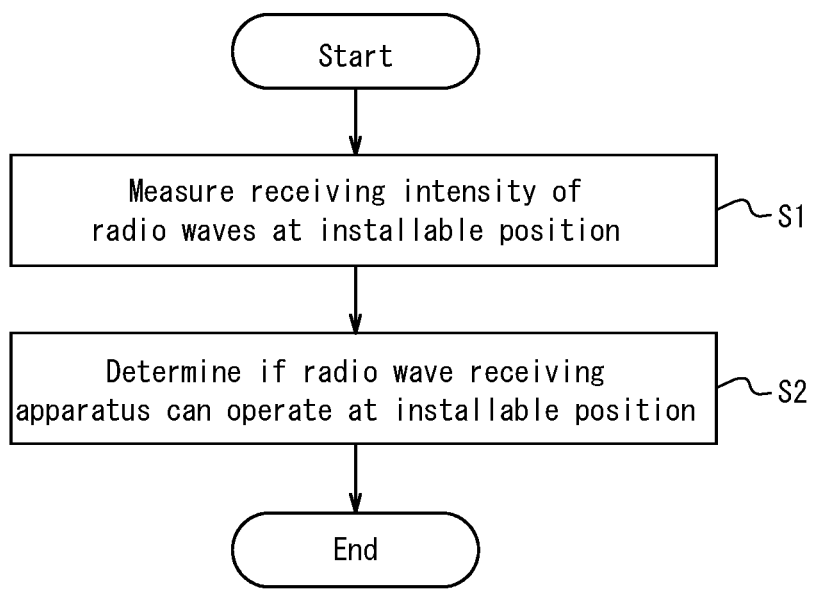
FIG. 4 is a flowchart illustrating an example of a procedure in which a measurement apparatus according to an embodiment determines whether or not a radio wave receiving apparatus can operate.

The measurement apparatus 10 may determine if the radio wave receiving apparatus 30 can operate when installed at the installable position according to the procedure illustrated in FIG. 4.

The controller 13 of the measurement apparatus 10 measures the reception intensity of radio waves at an installable position (step S1). In this case, the measurement apparatus 10 is installed at the installable position. The receiver 12 of the measurement apparatus 10 receives radio waves transmitted from the radio wave transmitting apparatus 20. The controller 13 calculates the intensity of radio waves received by the receiver 12.

The controller 13 determines if the radio wave receiving apparatus 30 can operate when installed at the installable position on the basis of the measured reception intensity (step S2). When the measured reception intensity is equal to or greater than a predetermined intensity, the controller 13 may determine that the radio wave receiving apparatus 30 can operate when installed at the installable position. The predetermined intensity may be determined on the basis of the intensity of radio waves transmitted by the radio wave transmitting apparatus 20. The predetermined intensity may be a product of the intensity of radio waves transmitted by the radio wave transmitting apparatus 20 and a predetermined coefficient. The predetermined coefficient may be equal to or less than one. The controller 13 may calculate the electricity obtainable by the radio wave receiving apparatus 30 installed at the installable position on the basis of the measured reception intensity. The controller 13 may determine if the radio wave receiving apparatus 30 can operate when installed at the installable position on the basis of the power consumption of the radio wave receiving apparatus 30. After step S2, the controller 13 ends the procedure of the flowchart in FIG. 4.

The radio waves transmitted from the radio wave transmitting apparatus 20 may include power feeding radio waves and communication radio waves. The power feeding radio waves may be radio waves to feed electricity to the radio wave receiving apparatus 30. The communication radio waves may be radio waves to communicate with the radio wave receiving apparatus 30. The intensity of the communication radio waves may be lower than that of the power feeding radio waves. The communication radio waves may be radio waves that are modulated by communication signals. The power feeding radio waves may be unmodulated radio waves. The half-value width of the frequency spectrum of the power feeding radio waves may be narrower than that of the communication radio waves. The narrower the half-value width of the frequency spectrum, the higher the efficiency of converting the radio waves into electricity. The radio wave receiving apparatus 30 may receive power feeding radio waves and communication radio waves by a single antenna or by separate antennas.

When transmitting power feeding radio waves, the radio wave transmitting apparatus 20 may apply beamforming to the power feeding radio waves on the basis of the radio waves containing pilot signals received from the radio wave receiving apparatus 30. The radio wave transmitting apparatus 20 may apply beamforming to power feeding radio waves in two or more directions simultaneously. The radio wave transmitting apparatus 20 may apply beamforming to power feeding radio waves in two or more directions in a time division manner.

The measurement apparatus 10 may receive communication radio waves transmitted from the radio wave transmitting apparatus 20 at an installable position where the radio wave receiving apparatus 30 can be installed. The measurement apparatus 10 may determine that the apparatus that transmits the communication radio waves is the radio wave transmitting apparatus 20 on the basis of a predetermined identifier contained in communication radio waves. When communication radio waves include wireless local area network (LAN) signals, the measurement apparatus 10 may determine if the apparatus that transmits communication radio waves is the radio wave transmitting apparatus 20 on the basis of a wireless LAN beacon. The wireless LAN beacon can include a character string called Service Set ID (SSID). The measurement apparatus 10 may determine, on the basis of whether or not a predetermined wording is included in SSID, if the apparatus that transmits the communication radio waves is the radio wave transmitting apparatus 20.

The measurement apparatus 10 may measure the reception intensity of the communication radio waves. The measurement apparatus 10 may measure the S/N ratio of the communication radio waves. The controller 13 of the measurement apparatus 10 may calculate the S/N ratio of the communication radio waves on the basis of the frequency spectrum of the communication radio waves received by the receiver 12, for example. When specifying that the apparatus that transmits the communication radio waves is the radio wave transmitting apparatus 20, the measurement apparatus 10 may measure the reception intensity or the S/N ratio of the communication radio waves.

The measurement apparatus 10 may calculate the electric power transmission efficiency of the power feeding radio waves transmitted from the radio wave transmitting apparatus 20 to the installable position on the basis of the S/N ratio of the communication radio waves transmitted from the radio wave transmitting apparatus 20. The electric power transmission efficiency of the power feeding radio waves may be represented by a ratio between the intensity of the power feeding radio waves arrived at the installable position and the intensity of power feeding radio waves transmitted from the radio wave transmitting apparatus 20. The measurement apparatus 10 may regard the intensity of the communication radio waves transmitted from the radio wave transmitting apparatus 20 as being constant. For example, the transmission intensity of the radio waves of wireless LAN beacon can be regarded as being constant. The measurement apparatus 10 may obtain the information about the intensity of the communication radio waves transmitted from the radio wave transmitting apparatus 20. The measurement apparatus 10 may calculate the electric power transmission efficiency of the power feeding radio waves on the basis of a ratio between the reception intensity and the transmission intensity of the communication radio waves. The measurement apparatus 10 may determine if the radio wave receiving apparatus 30 installed at the installable position can operate on the basis of the electric power transmission efficiency of the power feeding radio waves transmitted from the radio wave transmitting apparatus 20 to the installable position.

The frequency of the power feeding radio waves and the frequency of the communication radio waves may be included together in the same frequency band. For example, the frequency of the power feeding radio waves and the frequency of the communication radio waves may be included together in 2.4 GHz band, 5 GHz band, 920 MHz band and the like. The 2.4 GHz band may be a frequency band including a frequency of 2.4 GHz or more and 2.5 GHz or less. The 5 GHz band may be a frequency band including a frequency of 5.6 GHz or more and 5.8 GHz or less. The frequency of the power feeding radio waves and the frequency of the communication radio waves are not limited thereto, and may be included in the other frequency bands. When the frequency of the power feeding radio waves and the frequency of the communication radio waves are included in the same frequency band, the propagation channel of the power feeding radio waves and the propagation channel of the communication radio waves from the radio wave transmitting apparatus 20 to the radio wave receiving apparatus 30 may be the same or similar to each other. When the frequency of the power feeding radio waves and the frequency of the communication radio waves are included in the same frequency band, the measurement apparatus 10 can estimate the electric power transmission efficiency of the power feeding radio waves with a higher accuracy on the basis of the reception intensity of the communication radio waves. As a result, the measurement apparatus 10 can determine, with a higher accuracy, if the radio wave receiving apparatus 30 installed at an installable position can operate. When the frequency of the power feeding radio waves and the frequency of the communication radio waves are included in the same frequency band, the radio wave receiving apparatus 30 can receive the power feeding radio waves and the communication radio waves together with a single antenna. As a result usefulness of electric power transmission/reception can be enhanced.

The measurement apparatus 10 may calculate the necessary amount of the electric power of the power feeding radio waves transmitted from the radio wave transmitting apparatus 20 to the installable position on the basis of the electric power transmission efficiency of the power feeding radio waves and the power consumption of the radio wave receiving apparatus 30. The power of the power feeding radio waves that can be transmitted by the radio wave transmitting apparatus 20 can be also referred to as a radio wave feeding capability. The measurement apparatus 10 may calculate the radio wave feeding capability required by the radio wave receiving apparatus 30 installed at an installable position for the radio wave transmitting apparatus 20 on the basis of the electric power transmission efficiency of the power feeding radio waves and the power consumption of the radio wave receiving apparatus 30. The radio wave feeding capability required by the radio wave receiving apparatus 30 installed at an installable position is also referred to as a required capability of the radio wave receiving apparatus 30. The measurement apparatus 10 may calculate the required capability of the radio wave receiving apparatus 30 such that a product of the radio wave feeding capability and the electric power transmission efficiency of the power feeding radio waves is equal to or greater than the power consumption of the radio wave receiving apparatus 30.

When the radio wave transmitting apparatus 20 applies beamforming to the power feeding radio waves toward the installable position, the radio wave feeding capability can be represented by the power of the power feeding radio waves to which beamforming is applied from the radio wave transmitting apparatus 20 toward the installable position. When the radio wave transmitting apparatus 20 transmits power feeding radio waves toward the installable position in a time division manner, the radio wave feeding capability can be represented by the time average of the power of the power feeding radio waves transmitted from the radio wave transmitting apparatus 20 toward the installable position.

The required capability of the radio wave receiving apparatus 30 can be determined on the basis of the electric power transmission efficiency of the power feeding radio waves from the radio wave transmitting apparatus 20 to the installable position. The electric power transmission efficiency of the power feeding radio waves can be determined on the basis of the propagation channel of the radio waves from the radio wave transmitting apparatus 20 to the installable position. In other words, the required capability of the radio wave receiving apparatus 30 can be determined on the basis of the propagation channel of the radio waves from the radio wave transmitting apparatus 20 to the installable position. For example, the longer the propagation channel of the radio waves is, the larger the required capability of the radio wave receiving apparatus 30 can be. When an object that absorbs or scatters radio waves is located in the propagation channel of the radio waves, the required capability of the radio wave receiving apparatus 30 can be increased.

The measurement apparatus 10 may determine if the radio wave receiving apparatus 30 installed at an installable position can operate with the power feeding radio waves from the radio wave transmitting apparatus 20 on the basis of the required capability of the radio wave receiving apparatus 30 and the maximum value of the power of the power feeding radio waves that can be transmitted from the radio wave transmitting apparatus 20 to the installable position. The maximum value of the power of the power feeding radio waves that can be transmitted from the radio wave transmitting apparatus 20 to the installable position is also referred to as a power feeding margin. The power feeding margin of the radio wave transmitting apparatus 20 can be a power that can be obtained by subtracting the power of the power feeding radio waves already transmitted to the other radio wave receiving apparatus 30 from the maximum value of the power that can be transmitted by the radio wave transmitting apparatus 20. The measurement apparatus 10 may obtain the information about the power of the power feeding radio waves already transmitted to the other radio wave receiving apparatus 30 from the radio wave transmitting apparatus 20.

When the power feeding radio waves are transmitted to the other radio wave receiving apparatus 30 in a time division manner, the power of the power feeding radio waves already transmitted to the other radio wave receiving apparatus 30 may be calculated as the time average of the power transmitted to the other radio wave receiving apparatus 30. When the power feeding radio waves are always transmitted to the other radio wave receiving apparatus 30, the power of the power feeding radio waves already transmitted to the other radio wave receiving apparatus 30 may be the power always transmitted to the other radio wave receiving apparatus 30.

When the power feeding margin of the radio wave transmitting apparatus 20 is equal to or greater than the required capability of the radio wave receiving apparatus 30, the measurement apparatus 10 may determine that the radio wave receiving apparatus 30 installed at the installable position can be operated by the power feeding radio waves. When the power feeding margin of the radio wave transmitting apparatus 20 is less than the required capability of the radio wave receiving apparatus 30, the measurement apparatus 10 may determine that the radio wave receiving apparatus 30 installed at the installable position cannot be operated by the power feeding radio waves.

The measurement apparatus 10 may display the power feeding margin of the radio wave transmitting apparatus 20 on the display 14. The measurement apparatus 10 may extract the radio wave receiving apparatus 30 that can operate at the installable position on the basis of the power feeding margin of the radio wave transmitting apparatus 20 and the electric power transmission efficiency of the power feeding radio waves at the installable position and display it on the display 14. The measurement apparatus 10 may calculate the upper limit of the power consumption of the radio wave receiving apparatus 30 that can operate at the installable position on the basis of the power feeding margin of the radio wave transmitting apparatus 20 and the electric power transmission efficiency of the power feeding radio waves at the installable position and display it on the display 14.

The measurement apparatus 10 may accept an input of the information about a device that the user wants to install as the radio wave receiving apparatus 30 at the installable position. The information about the device may include, for example, the power consumption, the model number or the name of the device. The measurement apparatus 10 may determine, on the basis of the power feeding margin of the radio wave transmitting apparatus 20, whether or not the device can operate at the installable position and display the determination result on the display 14. The measurement apparatus 10 may correct the electric power transmission efficiency of the power feeding radio waves when the device is installed at the installable position on the basis of the model number or the name of the device input by the user. The electric power transmission efficiency of the power feeding radio waves may be corrected on the basis of the size, the shape or the other various attributes of the device. The measurement apparatus 10 may determine whether or not the device input by the user can operate at the installable position on the basis of the corrected electric power transmission efficiency of the power feeding radio waves and display the determination results on the display 14.

Figure 5:
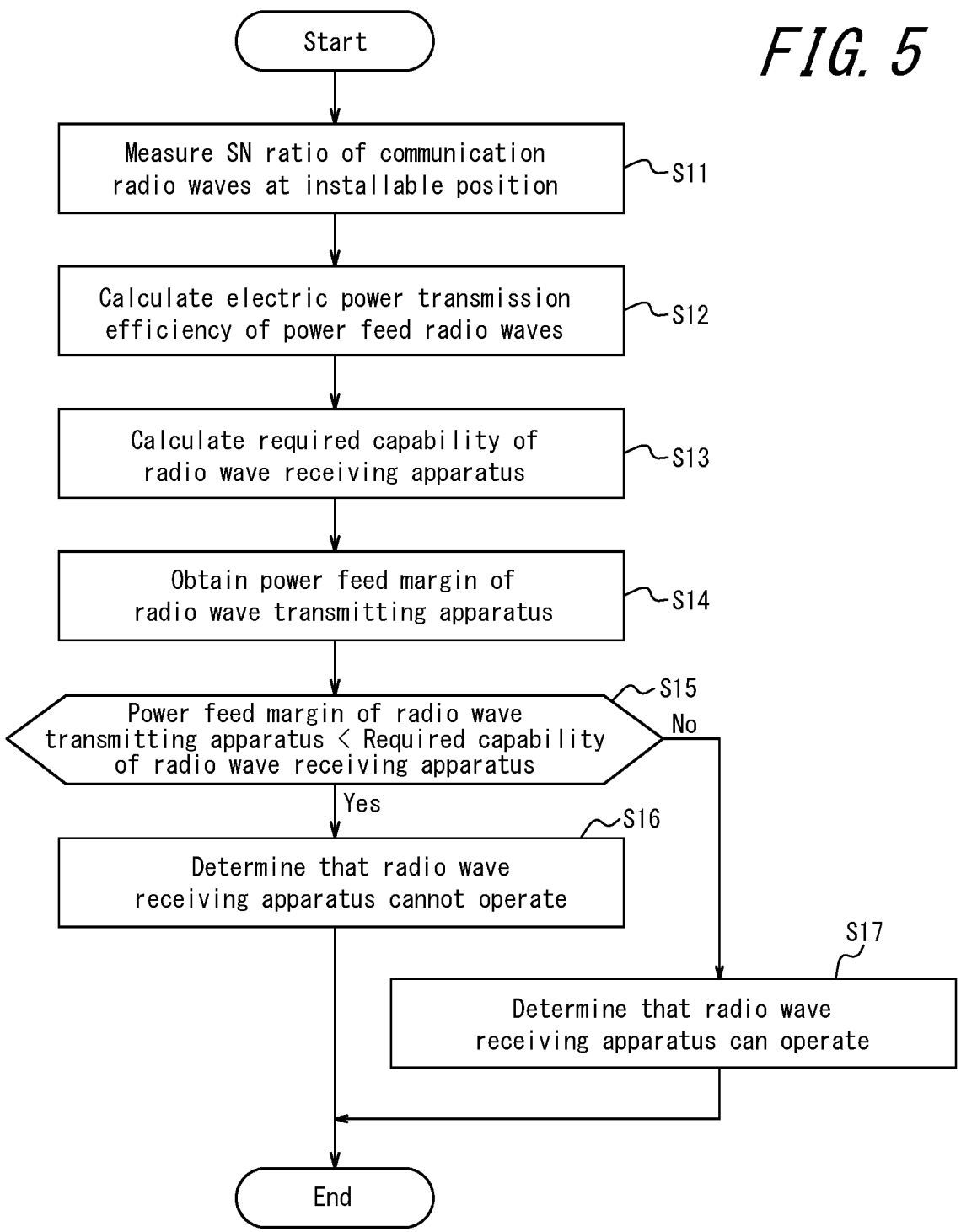
FIG. 5 is a flowchart illustrating an example of a procedure for determining whether or not the radio wave receiving apparatus can operate.

The measurement apparatus 10 may determine if the radio wave receiving apparatus 30 installed at the installable position can be operated by the power feeding radio waves according to the procedure illustrated in FIG. 5, for example.

The controller 13 of the measurement apparatus 10 measures the S/N ratio of the communication radio waves at the installable position (step S11). In this case, the measurement apparatus 10 is installed at the installable position. The receiver 12 of the measurement apparatus 10 receives communication radio waves transmitted from the radio wave transmitting apparatus 20. The controller 13 analyzes the communication radio waves received by the receiver 12 to calculate the S/N ratio of the communication radio waves. The controller 13 may calculate the S/N ratio of the communication radio waves by using various methods.

The controller 13 calculates the electric power transmission efficiency of the power feeding radio waves from the transmission apparatus 20 to the installable position on the basis of the S/N ratio of the communication radio waves (step S12). The controller 13 may calculate the electric power transmission efficiency of the power feeding radio waves on the basis of a table or function that indicates a relationship between the S/N ratio of communication radio waves and the electric power transmission efficiency of the power feeding radio waves.

The controller 13 calculates the required capability of the radio wave receiving apparatus 30 on the basis of the electric power transmission efficiency of the power feeding radio waves and the power consumption of the radio wave receiving apparatus 30 installed at the installable position (step S13). The controller 13 may obtain the power consumption of the radio wave receiving apparatus 30 installed at the installable position through input by the user of the measurement apparatus 10.

The controller 13 obtains the power feeding margin of the radio wave transmitting apparatus 20 (step S14). The controller 13 may obtain, from the radio wave transmitting apparatus 20, the maximum power of the power feeding radio waves that can be transmitted by the radio wave transmitting apparatus 20, as the power feeding margin of the radio wave transmitting apparatus 20. The controller 13 may obtain, from the radio wave transmitting apparatus 20, the maximum power of the power feeding radio waves that can be transmitted by the radio wave transmitting apparatus 20 toward the installable position, as the power feeding margin of the radio wave transmitting apparatus 20.

The controller 13 determines if the power feeding margin of the radio wave transmitting apparatus 20 is less than the required capability of the radio wave receiving apparatus 30 (step S15).

When the power feeding margin of the radio wave transmitting apparatus 20 is less than the required capability of the radio wave receiving apparatus 30 (Yes in step S15), the controller 13 determines that the radio wave receiving apparatus 30 cannot operate even when installed at the installable position (step S16). The controller 13 may cause the display 14 to display the determination result. After step S16, the controller 13 ends the procedure of the flowchart in FIG. 5.

When the power feeding margin of the radio wave transmitting apparatus 20 is not less than the required capability of the radio wave receiving apparatus 30 (No in step S15), the controller 13 determines that the radio wave receiving apparatus 30 can operate when installed at the installable position (step S17). The controller 13 may cause the display 14 to display the determination result. After step S17, the controller 13 ends the procedure of the flowchart in FIG. 5.

The measurement apparatus 10 according to this embodiment measures the reception intensity of the communication radio waves at the installable position, thus can determine if the radio wave receiving apparatus 30 can operate at the installable position without measuring the reception intensity of the power feeding radio waves. When the intensity of the communication radio waves is lower than that of the power feeding radio waves, since the measurement apparatus 10 can determine on the basis of the reception intensity of the communication radio waves, the radio wave transmitting apparatus 20 does not need to transmit unnecessary power feeding radio waves. In this manner, the power consumption of the radio wave transmitting apparatus 20 can be reduced, and as a result the usefulness of the power transmission/reception can be enhanced.

In the electric power transmission system 1 according to an embodiment, the measurement apparatus 10 may transmit the reception intensity of the communication radio waves received from the radio wave transmitting apparatus 20 to the radio wave transmitting apparatus 20. The radio wave transmitting apparatus 20 may calculate the power that can be fed to the radio wave receiving apparatus 30 installed at the installable position on the basis of the reception intensity of the communication radio waves at the measurement apparatus 10.

The radio wave transmitting apparatus 20 may obtain the information about a device that the user wants to install as the radio wave receiving apparatus 30 at the installable position. The radio wave transmitting apparatus 20 may determine whether or not the device that the user wants to install can operate at the installable position on the basis of the information about the device that the user wants to install as a radio wave receiving apparatus 30 at the installable position and the power that can be fed to the radio wave receiving apparatus 30 installed at the installable position. The measurement apparatus 10 may receive the determination result from the radio wave transmitting apparatus 20.

The measurement apparatus 10 may obtain, from the radio wave transmitting apparatus 20, the power that can be fed to the radio wave receiving apparatus 30 installed at the installable position. The measurement apparatus 10 may determine whether or not the device can operate at the installable position on the basis of the information about a device that the user wants to install at the installable position as a radio wave receiving apparatus 30 and the power obtained from the radio wave transmitting apparatus 20 and can be fed to the radio wave receiving apparatus 30 installed at the installable position.

In the electric power transmission system 1 according to an embodiment, the measurement apparatus 10 installed at the installable position may transmit radio waves containing pilot signals. The measurement apparatus 10 may transmit radio waves containing pilot signals to the radio wave transmitting apparatus 20 along a predetermined channel 18c illustrated in FIG. 1. The controller 23 of the radio wave transmitting apparatus 20 may obtain the information about the position of the measurement apparatus 10 on the basis of the radio waves containing pilot signals transmitted from the measurement apparatus 10. When obtaining the information about the position of the measurement apparatus 10, the controller 23 may apply beamforming to radio waves toward the position of the measurement apparatus 10. The controller 23 may apply beamforming to radio waves in the direction of arrival of the radio waves containing pilot signals transmitted from the measurement apparatus 10. When the radio waves containing pilot signals arrive from the predetermined channel 18c, the controller 23 may apply beamforming to the radio waves toward the predetermined channel 18c. The measurement apparatus 10 may receive the radio waves to which beamforming is applied toward itself and measure the intensity thereof. The measurement apparatus 10 may determine if the radio wave receiving apparatus 30 can operate at the installable position on the basis of the intensity of the radio waves to which beamforming is applied toward itself.

The measurement apparatus 10 and the radio wave transmitting apparatus 20 may determine if the radio wave receiving apparatus 30 can operate at the installable position according to the procedure illustrated in FIG. 6, for example.

The transmitter 11 of the measurement apparatus 10 installed at the installable position transmits radio waves containing pilot signals (step S21). The radio waves containing pilot signals transmitted from the transmitter 11 can arrive at the radio wave transmitting apparatus 20.

The receiver 22 of the radio wave transmitting apparatus 20 receives radio waves containing pilot signals (step S22). The receiver 22 may detect the arrival direction of the radio waves containing pilot signals. The controller 23 of the radio wave transmitting apparatus 20 may obtain the arrival direction of the radio waves containing pilot signals detected by the receiver 22 as the information about the position of the measurement apparatus 10. The controller 23 may obtain the information about the position of the measurement apparatus 10 on the basis of the pilot signal.

The controller 23 of the radio wave transmitting apparatus 20 applies beamforming to radio waves toward the installable position where the measurement apparatus 10 is installed (step S23). The controller 23 causes the transmitter 21 to transmit the radio waves to which beamforming is applied toward the installable position. The radio waves to which beamforming is applied toward the installable position can arrive at the measurement apparatus 10 installed at the installable position. After step S23, the radio wave transmitting apparatus 20 may end the procedure of the flowchart in FIG. 6.

The receiver 12 of the measurement apparatus 10 receives the radio waves to which beamforming is applied toward the installable position (step S24).

The controller 13 of the measurement apparatus 10 measures the intensity of the radio waves to which beamforming is applied (step S25). The controller 13 calculates the intensity of the radio waves received by the receiver 12, the radio waves being applied with beamforming by the radio wave transmitting apparatus 20.

The controller 13 determines, on the basis of the measured reception intensity, if the radio wave receiving apparatus 30 can operate when installed at the installable position (step S26). The controller 13 may determine if the radio wave receiving apparatus 30 can operate when installed at the installable position according to the procedure that is the same as or similar to that included in step S2 in FIG. 4. After step S26, the measurement apparatus 10 ends the procedure of the flowchart in FIG. 6.

As illustrated in FIG. 7, the electric power transmission system 1 according to an embodiment may be connected to the network 2 via the radio wave transmitting apparatus 20. The network 2 may be internet or intranet, for example. The radio wave receiving apparatus 30 may transmit/receive data with the network 2 via the radio wave transmitting apparatus 20. In other words, the radio wave transmitting apparatus 20 may act as a router. Since the radio wave transmitting apparatus 20 acts as a router, the electric power transmission system 1 is not needed to have an apparatus that transmits power feeding radio waves and a router individually. As a result the cost for constituting the electric power transmission system 1 can be reduced.

The measurement apparatus 10 according to an embodiment may determine if the radio wave receiving apparatus 30 operates at the installable position on the basis of the reception intensity of the communication radio waves transmitted from the radio wave transmitting apparatus 20. When the measurement apparatus 10 determines on the basis of the reception intensity of the communication radio waves, the function of the measurement apparatus 10 can be realized by a terminal that can receive communication radio waves. In this case, a terminal that realizes the function of the measurement apparatus 10 is not needed to receive power feeding radio waves. For example, the function of the measurement apparatus 10 can be realized by a communication terminal such as a mobile phone or a smart phone that can receive communication radio waves. Since the function of the measurement apparatus 10 is realized by a communication terminal, it is not necessary to prepare a dedicated apparatus as the measurement apparatus 10. In other words, a general terminal can be used as the measurement apparatus 10. As a result the cost of the measurement apparatus 10 can be reduced. The measurement apparatus 10 may be realized by causing a terminal or the like to execute application program. This embodiment can be realized as application program to be executed by the measurement apparatus 10 including a terminal and the like. This embodiment can be realized also as a measurement method to be executed by the measurement apparatus 10 including a terminal and the like.

The application program that realizes the function of the measurement apparatus 10 according to this embodiment may have a function of controlling the radio wave receiving apparatus 30. The application program may have a function of setting parameters of the radio wave receiving apparatus 30. The application program may have a function of receiving a various types of information from the radio wave receiving apparatus 30. For example, the application program may have a function of obtaining an image from the camera 30a or setting an imaging frequency of the camera 30a. The application program may have a function of obtaining detection results from the sensor 30b or setting a detection sensitivity of the sensor 30b. The terminal that executes the application program may communicate with the radio wave receiving apparatus 30 via the radio wave transmitting apparatus 20 or via the other apparatus.

The radio wave receiving apparatus 30 according to an embodiment may receive communication radio waves transmitted from the radio wave transmitting apparatus 20 and convert at least a part of the received communication radio waves into electricity. When receiving communication radio waves transmitted from the radio wave transmitting apparatus 20 to the other radio wave receiving apparatus 30, the radio wave receiving apparatus 30 may convert the received communication radio waves into electricity. The radio wave receiving apparatus 30 may operate with the power obtained through conversion of communication radio waves. In other words, the radio wave receiving apparatus 30 may execute energy harvesting. In this manner usefulness of electric power transmission and reception can be enhanced.

The measurement apparatus 10 may measure the reception intensity of the communication radio waves at an installable position where the radio wave receiving apparatus 30 can be installed, and on the basis of the measurement result, calculate the electric power that can be obtained by the radio wave receiving apparatus 30 from the communication radio waves at the installable position. When the power that can be obtained by the radio wave receiving apparatus 30 at the installable position is a predetermined power or more, the measurement apparatus 10 may determine that the radio wave receiving apparatus 30 can operate when installed at the installable position. In other words, the measurement apparatus 10 may determine that the radio wave receiving apparatus 30 can operate with the power converted from the communication radio waves when it is installed at the installable position, on the basis of the reception intensity of the communication radio waves measured at the installable position.

The measurement apparatus 10 according to an embodiment may transmit the measurement result of the reception intensity of the radio waves transmitted from the radio wave transmitting apparatus 20 to the radio wave transmitting apparatus 20. The radio wave transmitting apparatus 20 may determine, on the basis of the measurement result received from the measurement apparatus 10, if the radio wave receiving apparatus 30 can operate when installed at the installable position. The radio wave transmitting apparatus 20 may transmit the determination result to the measurement apparatus 10 via the transmitter 21. The measurement apparatus 10 may receive the determination result. In this manner the load on the measurement apparatus 10 can be reduced.

Although the embodiment according to this disclosure has been described on the basis of the drawings and the examples, it is to be understood that various changes and modifications may be made easily on the basis of this disclosure by those who are ordinarily skilled in the art. Accordingly, such changes and modifications are included in the scope of the disclosure herein. For example, functions and the like included in each component, each step and the like may be rearranged without logical inconsistency. A plurality of components or steps can be combined into one or divided. The embodiment according to this disclosure can be realized as a method or program executed by a processor provided to the apparatus, or a storage medium that stores program. It is to be understood that they are included in the scope of this disclosure.

The invention claimed is:

1. A measurement method, comprising:
measuring, by a measuring apparatus positioned at an installable position of a radio wave receiving apparatus operated by power of radio waves from a radio wave transmitting apparatus, a reception intensity of radio waves from the radio wave transmitting apparatus; and
determining, by a controller of the measuring apparatus on the basis of the reception intensity of the radio waves measured by the measuring apparatus and a corrected electric power transmission efficiency which is corrected based on a characteristic of the radio wave receiving apparatus, if the reception intensity of the radio waves incident at the installable position is at a level sufficient to operate the radio wave receiving apparatus when installed at the installable position, the characteristic comprising at least one of a model number of the radio wave receiving apparatus, a name of the radio wave receiving apparatus, a size of the radio wave receiving apparatus or a shape of the radio wave receiving apparatus.

2. The measurement method according to claim 1, wherein
the radio waves include power feeding radio waves and communication radio waves having an intensity lower than that of the power feeding radio waves;
the radio wave receiving apparatus operates with a power of the power feeding radio waves; and
the method further comprising determining, on the basis of a reception intensity of the communication radio waves, if the radio wave receiving apparatus can operate when installed at the installable position.

3. The measurement method according to claim 2, wherein the power feeding radio waves and the communication radio waves are included in a same frequency band.

4. The measurement method according to claim 3, further comprising:
calculating, on the basis of the reception intensity of the radio waves, a power feeding margin from the radio wave transmitting apparatus to the radio wave receiving apparatus; and
determining, on the basis of the power feeding margin, if the radio wave receiving apparatus can operate when installed at the installable position.

5. The measurement method according to claim 2, further comprising:
calculating, on the basis of the reception intensity of the radio waves, a power feeding margin from the radio wave transmitting apparatus to the radio wave receiving apparatus; and
determining, on the basis of the power feeding margin, if the radio wave receiving apparatus can operate when installed at the installable position.

6. The measurement method according to claim 2, further comprising determining, on the basis of power consumption of the radio wave receiving apparatus, if the radio wave receiving apparatus can operate.

7. The measurement method according to claim 2, further comprising transmitting a pilot signal to the radio wave transmitting apparatus, wherein the radio waves are applied with beamforming toward the installable position on the basis of the pilot signal.

8. The measurement method according to claim 2, further comprising:
transmitting a measurement result of the reception intensity of the radio waves to the radio wave transmitting apparatus; and
receiving, from the radio wave transmitting apparatus, a determination result regarding if the radio wave receiving apparatus can operate when installed at the installable position on the basis of the measurement result of the reception intensity of the radio waves.

9. The measurement method according to claim 1, wherein
the radio waves include communication radio waves;
the radio wave receiving apparatus operate with power of the communication radio waves; and
the method further comprising determining, on the basis of the reception intensity of the communication radio waves, if the radio wave receiving apparatus can operate when installed at the installable position.

10. The measurement method according to claim 9, further comprising:
calculating, on the basis of the reception intensity of the radio waves, a power feeding margin from the radio wave transmitting apparatus to the radio wave receiving apparatus; and
determining, on the basis of the power feeding margin, if the radio wave receiving apparatus can operate when installed at the installable position.

11. The measurement method according to claim 1, further comprising:
calculating, on the basis of the reception intensity of the radio waves, a power feeding margin from the radio wave transmitting apparatus to the radio wave receiving apparatus; and
determining, on the basis of the power feeding margin, if the radio wave receiving apparatus can operate when installed at the installable position.

12. The measurement method according to claim 1, further comprising determining, on the basis of power consumption of the radio wave receiving apparatus, if the radio wave receiving apparatus can operate.

13. The measurement method according to claim 1, further comprising transmitting a pilot signal to the radio wave transmitting apparatus, wherein the radio waves are applied with beamforming toward the installable position on the basis of the pilot signal.

14. The measurement method according to claim 1, further comprising:
transmitting a measurement result of the reception intensity of the radio waves to the radio wave transmitting apparatus; and
receiving, from the radio wave transmitting apparatus, a determination result regarding if the radio wave receiving apparatus can operate when installed at the installable position on the basis of the measurement result of the reception intensity of the radio waves.

15. A non-transitory computer-readable medium including a program for causing a measurement apparatus installed at an installable position of a radio wave receiving apparatus operated by power of radio waves from a radio wave transmitting apparatus to measure a reception intensity of radio waves from the radio wave transmitting apparatus, and for causing a controller of the measurement apparatus to determine, on the basis of the reception intensity of the radio waves and a corrected electric power transmission efficiency which is corrected based on a characteristic of the radio wave receiving apparatus, if the reception intensity of the radio waves incident at the installable position is at a level sufficient to operate the radio wave receiving apparatus when installed at the position, the characteristic comprising at least one of a model number of the radio wave receiving apparatus, a name of the radio wave receiving apparatus, a size of the radio wave receiving apparatus or a shape of the radio wave receiving apparatus.

16. The non-transitory computer-readable medium according to claim 15, the program being configured to cause the measurement apparatus to transmit a pilot signal to the radio wave transmitting apparatus, the radio waves being applied with beamforming from the radio wave transmitting apparatus toward the position on the basis of the pilot signal.

17. A measurement apparatus, comprising:
- a receiver configured to receive radio waves from a radio wave transmitting apparatus at an installable position of a radio wave receiving apparatus operated by power of radio waves from the radio wave transmitting apparatus; and
- a controller configured to measure a reception intensity of the radio waves to determine, on the basis of the reception intensity of the radio waves and a corrected electric power transmission efficiency which is corrected based on a characteristic of the radio wave receiving apparatus, if the reception intensity of the radio waves incident at the installable position is at a level sufficient to operate the radio wave receiving apparatus when installed at the installable position, the characteristic comprising at least one of a model number of the radio wave receiving apparatus, a name of the radio wave receiving apparatus, a size of the radio wave receiving apparatus or a shape of the radio wave receiving apparatus.

18. The measurement apparatus according to claim 17, wherein
- the radio waves include power feeding radio waves and communication radio waves having an intensity lower than that of the power feeding radio waves; and
- the measurement apparatus can communicate with the radio wave transmitting apparatus by the communication radio waves and cannot operate by power of the power feeding radio waves.

\* \* \* \* \*